United States Patent [19]

Hartman et al.

[11] Patent Number: 5,437,092
[45] Date of Patent: Aug. 1, 1995

[54] METHOD OF MAKING CONTACT AREAS ON AN OPTICAL WAVEGUIDE

[75] Inventors: Davis H. Hartman, Phoenix; Michael S. Lebby; Shun-Meen Kuo, both of Chandler; Christopher K. Y. Chun, Mesa, all of Ariz.

[73] Assignee: Motorola, Inc., Schaumburg, Ill.

[21] Appl. No.: 184,805

[22] Filed: Jan. 21, 1994

Related U.S. Application Data

[62] Division of Ser. No. 912,367, Jul. 13, 1992, Pat. No. 5,282,071.

[51] Int. Cl.⁶ .................................................. H01P 11/00
[52] U.S. Cl. ................................. 29/600; 29/527.2; 228/174; 228/180.1
[58] Field of Search ............... 228/180.1, 174; 29/527.2, 600, 848, 852; 174/250

[56] References Cited

U.S. PATENT DOCUMENTS

| | | | |
|---|---|---|---|
| 4,785,271 | 11/1988 | Higgins, Jr. | 29/600 X |
| 4,985,990 | 1/1991 | Cronin et al. | 29/848 X |
| 5,239,598 | 8/1993 | Wight et al. | |
| 5,282,071 | 1/1994 | Hartman et al. | |

*Primary Examiner*—Carl J. Arbes
*Attorney, Agent, or Firm*—Gary F. Witting

[57] ABSTRACT

An article and a method for making contact areas (221, 222, 230) on an optical waveguide (100, 200) are provided. A waveguide (100, 200) having a first surface (112) and a second surface (113) with a first indent (101) located on the first surface (112) and a second indent (102) located on the second surface (113) and a groove (104) is made interconnecting the first and second indents (101, 102). A low temperature melting member (111) is placed in the first indent (101) on the first surface (112) and is melted, thereby flowing the low temperature melting member into the groove (104) and into the second indent (102) located on the second surface (113).

9 Claims, 3 Drawing Sheets

METHOD OF MAKING CONTACT AREAS ON AN OPTICAL WAVEGUIDE

This is a division of application Ser. No. 07/912,367, filed Jul. 13, 1992, now U.S. Pat. No. 5,282,071.

BACKGROUND OF THE INVENTION

This invention relates, in general, to fabrication of optical devices and, more particularly, to interconnecting optical devices and waveguides together.

This application is related to copending application that bears Ser. No. 07/889,335, titled MOLDED WAVEGUIDE AND METHOD OF MAKING SAME, filed on May 28, 1992, issued on Jan. 25, 1994 and having U.S. Pat. No. 5,282,071, which is hereby incorporated by reference herein.

At present, interconnection of an optical device and a waveguide is a difficult task that typically is achieved by use of hand methods or use of semiautomatic methods for interconnection or mating of the waveguide and the optical device. Generally, these methods are complex, inefficient, and not suitable for high volume manufacturing. However, a major problem associated with interconnection of optical devices to waveguides is a fabrication method and structure that will allow electrical and mechanical coupling between the optical device and the waveguide.

In the prior art, interconnection of the optical device and the waveguide typically is achieved by carefully aligning the optical device to the waveguide by hand, commonly called active alignment, and subsequently cementing or adhering the optical device to the waveguide. However, many problems arise by aligning the optical device and the waveguide by hand, such as being extremely labor intensive, costly, inaccuracy of alignment, and the like. Further, curing of the adhesive that binds the optical device and the waveguide together often results in a shifting of the alignment of the optical device to the waveguide, thus causing a potential inefficient transfer of light from the optical device. Moreover, if the misalignment is severe enough, unusable product is manufactured, thus increasing cost and reducing manufacturing capability.

It can be readily seen that conventional methods for connecting an optical device to a waveguide have severe limitations. Also, it is evident that the conventional processes that are used to fabricate the interconnection between the optical device and the waveguide are not only complex and expensive, but also not effective processes. Therefore, a method for making an interconnection between an optical device and a waveguide would be highly desirable.

SUMMARY OF THE INVENTION

Briefly stated, an article and a method for making contact areas on a plastic optical waveguide is provided. A molded waveguide having a first surface and a second surface with a first indent located on the first surface and a second indent located on the second surface, and a groove is molded interconnecting the first and second indents. A low temperature melting member is placed in the first indent on the first surface and is melted, thereby flowing the low temperature melting member into the groove and into the second indent located on the second surface.

DETAILED DESCRIPTION OF THE DRAWINGS

Figure 1:
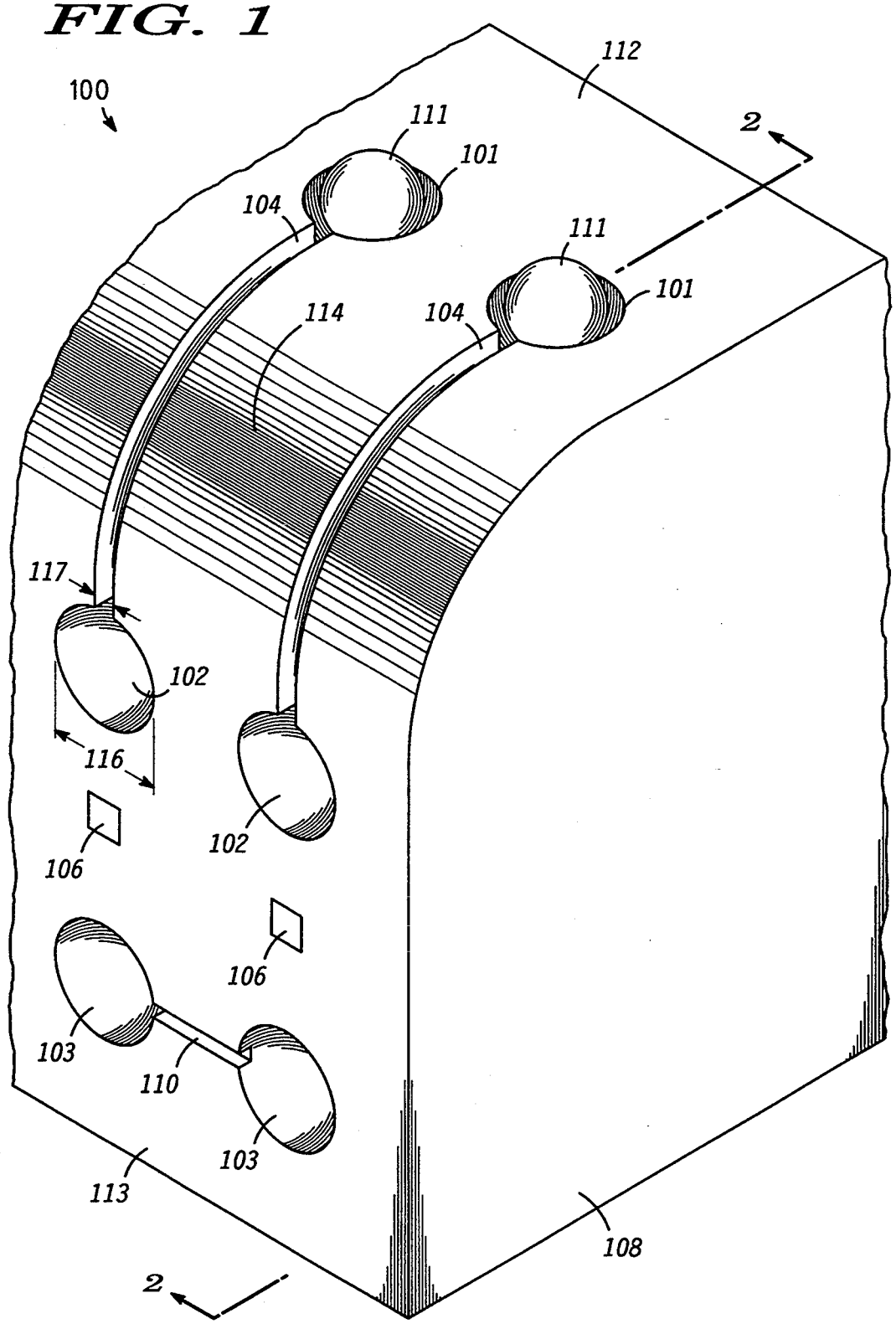
FIG. 1 is an enlarged simplified perspective view of contact areas embodying the present invention.
Figure 2:
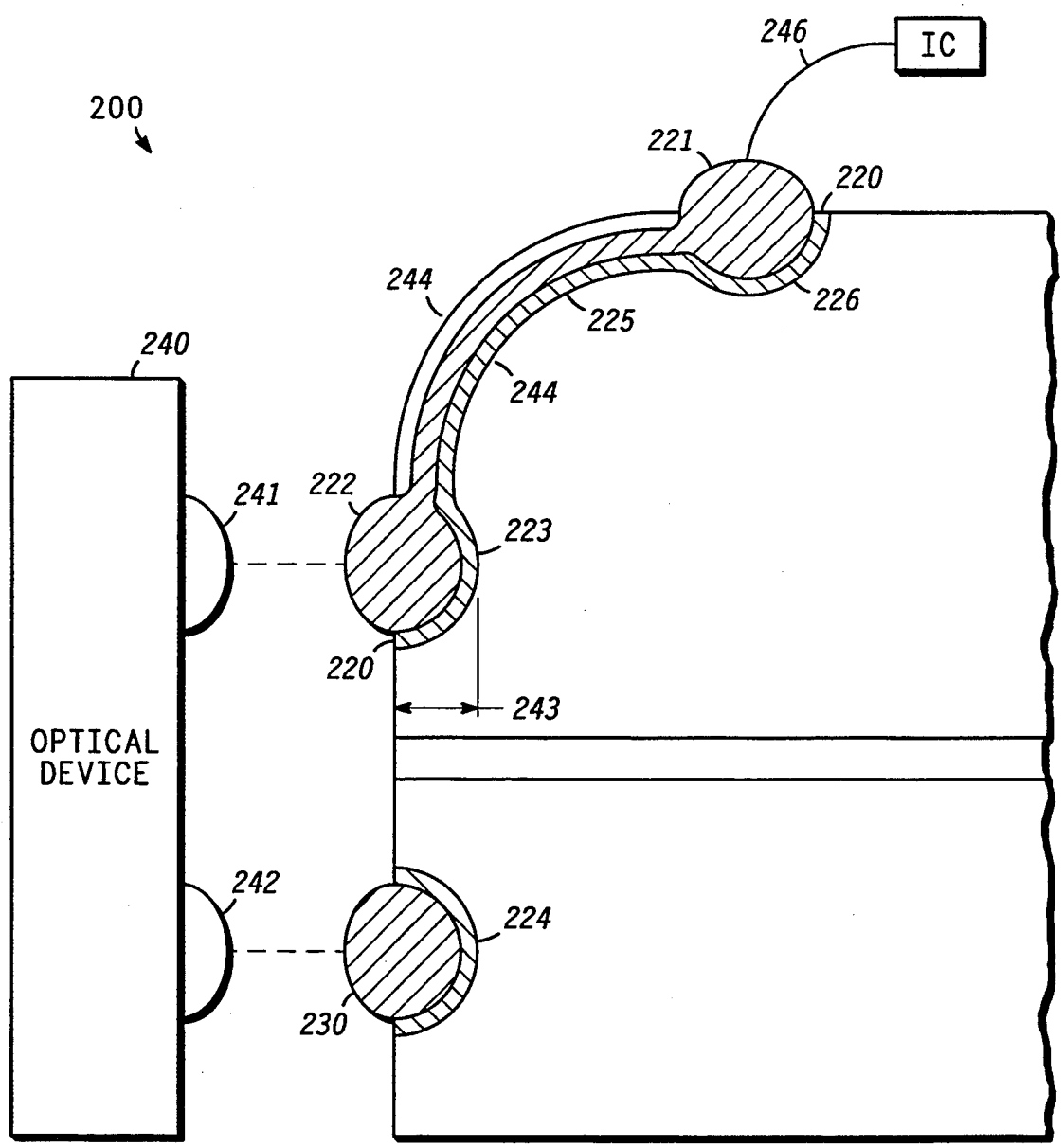
FIG. 2 is an enlarged cross-sectional view as seen from the line 2—2 in FIG. 1 after heat treatment.

FIG. 1 is an enlarged simplified perspective view of an optical waveguide 100 illustrating a partially completed embodiment. Typically, waveguide 100 is fabricated with a plurality of core regions 106 that are surrounded by a cladding region 108. Also, FIG. 2 is a simplified cross-sectional view as seen from the line 2—2 of FIG. 1 after heat treatment. Referring now to both FIGS. 1 and 2 a combination of processes and structures are described that allows for an accurate, an efficient, and highly manufacturable method for making contacts 221 and 222 on a base such as waveguide 200.

Generally, both core regions 106 and cladding region 108 are made of a hard optically transparent polymer, wherein core regions 106 have a higher refractive index than do cladding region 108, thus allowing efficient light confinement and efficient light transmission through core region 106. Commonly, there is a refractive index difference of at least 0.01 between core region 106 and cladding region 108. In an embodiment of the contact areas, waveguide 100 is made in accordance with copending application previously mentioned hereinabove. In the present invention, waveguide 100 is made with indents 101 on surface 112, indents 102 on surface 113, and grooves 104 in surface 114 that interconnect indents 101 and 102. While surface 114 is shown as a curved surface, it should be understood that other surface geometry's are possible, such as a plane surface, a faceted surface, a beveled surface, or the like. Further, indents 103 on surface 113 and grooves 110 also on surface 113 are formed depending upon the specific application.

More specifically, indents 101, 102, 103, and grooves 104 and 110 are made using a variety of fabrication methods, such as milling, chemical etching, molding, or the like. However, in a preferred embodiment of the present invention, indents 101, 102, 103, and grooves 104 and 110 are molded during fabrication of waveguide 100. Also, indents 101, 102, and 103 can be fabricated in a wide variety of geometric shapes and designs having depth, such as rectangles, spherical, cylindrical or the like. By molding indents 101, 102, 103, and grooves 104 and 110, an accurate and repeatable process is achieved which allows for automated manufacturing, thus reducing cost. Further, grooves 104 and 110 also can be made with a variety of geometric shapes and designs, such as rectangular channels, V-grooves, U-grooves, tunnels, or the like.

In the embodiment of the present invention as shown in FIG. 1, indents 101, 102, and 103 are made in a spherical geometric shape, and grooves 104 and 110 are made in a U-groove shape. Typically, indents 101, 102, and 103 have a diameter, as shown by arrows 116, that ranges from 2.0 mills (50.8 microns) to 5.0 mills (167.0 microns) and a depth, as shown by arrows 243, that ranges from 2.0 mills (50.8 microns) to 4.0 mills (91.6 microns). In a preferred embodiment of the present invention, diameter, as shown by arrows 116, of indents 101, 102, and 103 ranges from 3.0 mills (76.2 microns) to 4.0 mills (111.6 microns) with depth, as shown by arrows 243, of 1.0 mills (25.4 microns) to 3.0 mills (76.2 microns). Grooves 104 and 110 have a depth, as shown by arrows 244, ranging from 0.3 mills (7.62 microns) to 3.0 mills (76.2 microns) and with a width, as shown by arrows 117, ranging from 0.3 mills (7.62 microns) to 3.0 mills (76.2 microns), with a preferred depth ranging from 2.0 mills (50.8 microns) to 4.0 mills (111.6 microns) and a preferred width ranging from 2.0 mills (50.8 microns) to 4.0 mills (111.6 microns), respectively.

Once specific geometric patterning or configuration (i.e., indents 101, 102, 103, and grooves 104 and 110) of waveguide 100 and core regions 106 and cladding region 108 are completed, waveguide 100 is ready for additional processing. Typically, waveguide 100 is coated with a thin metallic layer 220 which at least covers bottom surfaces 226, 225, 223, and 224 of indents 101, 102, 103, and grooves 104 and a bottom surface of groove 110 (not shown). Typically, metallic layer 220 is made of a metal or metal alloy, such as aluminum, platinum, palladium, titanium/tungsten (TiW), or a combination thereof. Application or deposition of metal layer 220 is accomplish by several well-known methods in the semiconductor art, such as evaporation methods or sputtering methods. Thickness of metal layer 220 ranges from 0.00039 mills (0.01 micron) to 0.03937 mills (1.0 micron). Further, it should be noted that while many different materials could be used for layer 220, selection of the metal material used for making metal layer 220 is dependent upon specific applications, as well as subsequent processing steps, for example, etching and wirebonding.

For the sake of simplicity and for a greater understanding of the present invention, further description will be limited to processing of indents 101, 102, and groove 104. However, it should be understood that these processes are equally applicable to indents 103 and grooves 110 of waveguide 100.

After metallic layer 220 is deposited on waveguide 200, solder members 111 typically are placed in indent 101 by a robotic arm (not shown) that is computer controlled (not shown), thereby facilitating automated manufacturing. Generally, solder members 111 are made of any number of suitable materials, such as solder paste, gold balls, silver balls, bump balls, or the like. However in a preferred embodiment of the present invention solder members are bump balls and are referred to as such hereinafter. Bump balls 111 are held in place by any number of several methods, such as adhering bump balls 111 with a solder flux material that has been previously applied to at least the bottom of either indent 102 or 101 or physically adhering bump ball 111 to indent 101. In a preferred embodiment of the present invention, bump balls 111 are physically secured in indents 111 by a robotic arm that sonically welds bump balls 111 to metal layer 220, thus holding bump ball 111 firmly in place.

In a preferred embodiment of the present invention, bump balls 111 typically are made of a low melting metal material or metal alloy material. In general, bump balls are manufactured by atomizing liquid solder or liquid metal to form spherical shaped balls of solder or metal. Chemical composition and size of bump balls vary greatly and selection of specific bump ball type is dependent upon specific application and use. Moreover, melting points of bump balls 111 are adjustable over a wide range of temperatures by combining low melting materials with well-known solders or metals that are commercially available. For example only, gallium may be added to a common lead/tin solder composition to lower the melting temperature, thus enabling the adjustment of melting temperature of the lead/tin composition. Further, bump balls are commercially available from a large number of vendors one of which is ALPHA METALS INC. located in Jersey City, N.J.

In the present invention, bump balls 111 are made with a metal alloy that has a melting point that ranges between 50.0 degrees Celsius to 250.0 degrees Celsius. However, in a preferred embodiment of the present invention, the melting point of bump balls 111 has a range between 150.0 degrees Celsius and 200.0 degrees Celsius.

Once bump balls 111 have been placed and affixed to either indents 101 or 102, waveguide 100 with bump balls 111 are subsequently heated or thermally processed, thus making bump balls 111 melt into a liquid metal or liquid solder. Thermal processing typically is accomplished by any number of methods, such as laser heating, convection heating, or the like. By heating waveguide 100 or at least solder member 111, solder member 111 melts or reflows and liquid solder travels from indents 101 through grooves 104 and into indents 102. It is believed that the liquid solder traveling through grooves 104 is added by a wetting action of metal layer 220 as well as capillary action of groove 104. Further, the liquid solder not only travels through groove 104, but also, beads in indents 101 and 102, thus forming contacts 221 and 222. Additionally, it is further believed that surface tension of the liquid solder allows at least in part for a beading or a pooling of the liquid solder in indents 101 and 102. Subsequently, waveguide 200 is allowed to cool, thus resolidifying the liquid solder in indents 101 and 102 and electrically and mechanically interconnecting indents 101 and 102 through channel 104.

After the liquid solder has cooled and resolidified, waveguide 200 is etched. Typically, waveguide 200 is etched in an isotropic manner by either a dry chemical etch or a wet chemical etch. However, it should be understood that depending upon specific metallic layer 220 a more physical etching process is used, such as ion milling. Selection of a specific etch treatment is dependent upon the specific material used for metallic layer 220. Generally, etching of waveguide 200 removes unwanted portions of metallic layer 220, thus isolating groups of indents 101, 102, and grooves 104 that are interconnected by solder or metal through groove 104 from other groups. By way of example only, with metallic layer 220 being made of TiW and indents 101, 102 and groove 104 being filled with resolidified solder, waveguide 200 is etched in an isotropic fluorocarbon based chemistry, thus removing unwanted portions of metallic layer 220 from between each specific group that includes indents 101, 102, and groove 104 while not significantly effecting the resolidified solder. Removal of unwanted portions of layer 220 electrically isolates each specific group, thus allowing indents 101 and 102 filled with resolidified solder to become contacts 221 and 222 where additional electrical connections are attached, such as wirebonding 246 or bump bonding to an interconnection board, integrated circuit (IC), optical device, or the like. Also, it should be understood that contacts 230 are formed in the same manner as contacts 221 and 222.

Further, after removal of unwanted portions of metallic layer 220 is completed, different chemical etchants are sometimes used to chemically polish exposed surfaces of waveguide 200.

Upon completion of forming contact 221, 222, and 230, an optical device 240 is mounted to waveguide 200. Optical device 240 is an optoelectronic device, such as a photoreceiver or a phototransmitter. Typically, optical device 240 is fitted with contacts or bump pads 241 and 242 that match contacts 222 and 230 respectively. Bonding of optical device 240 to waveguide 200 is achieved by affixing optical device contacts 241 and 242 to waveguide contacts 222 and 230. Typically, this process is called bumping.

Additionally, contact 221 of waveguide 200 typically is wirebonded to an integrated circuit (IC) on an interconnect board (not shown), illustrated by line 246 coupled to IC, thus supplying an electronic communicative link to standard electronics.

Figure 3:
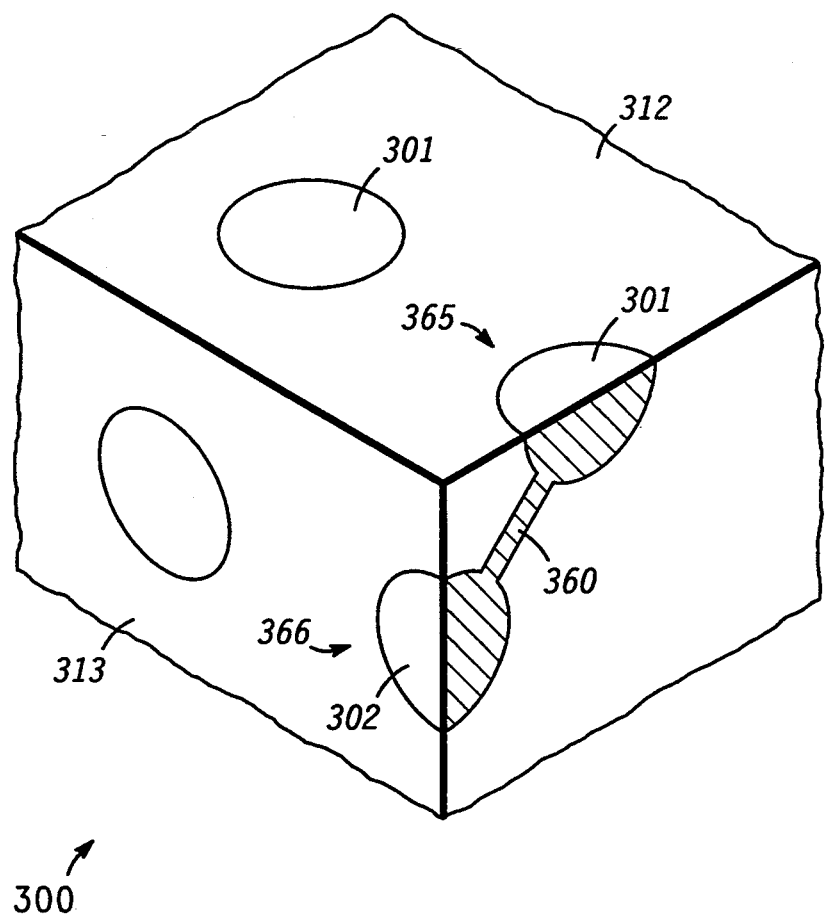
FIG. 3 is an enlarged simplified perspective cross-sectional view of another embodiment of contact areas incorporating the present invention.

FIG. 3 is a simplified perspective cross-sectional view of a portion another embodiment 300 of the contact areas. Generally, indents 301 and 302 are placed on surfaces 312 and 313. Surfaces 312 and 313 in this particular embodiment are made at a right angle to each other. Tunnel 360 is made so as to interconnect indent 301 and 302. Typically, indents 301 and 302, and tunnel 360 are made by a number of methods previously described, such as milling, etching, or the like; however, in a preferred embodiment of the present invention indents 301 and 302, and tunnel 360 are fabricated using the molding method as previously discussed. Also, it should be understood by one of ordinary skill in the art that injection molding is capable of forming waveguide 300.

An electrical mechanical contact is made by filling indents 301 and 302 and tunnel 360 with an electrically conductive material. Typically, filling of both indents 301, 302 and tunnel 360 is achieved by affixing a solder member (not shown) to either indent 301 or 302 and subsequently heating the solder member, thus melting the solder member and flowing the solder from indent 301 to indent 302 through tunnel 360. Generally, waveguide 300 is heated by any number of methods previously discussed. However, in a preferred embodiment of the present invention, the solder member is thermally heated with a convection oven. Once the solder member is heated sufficiently to liquefy, the liquid solder is drawn through tunnel 360 by capillary action and beads in both indents 301 and 302 forming contacts 365 and 366. Alternatively, the liquid solder is transportable from indent 301 through tunnel 360 and into indent 302 and is assisted when necessary by placing a vacuum or a negative pressure at indent 302, thus drawing the liquid solder from indent 301, through tunnel 360 and into indent 302. Once cooling of the liquid solder is completed, contacts 365 and 366 are either ready for use or are further processed.

By now it should be appreciated that method for making contacts for an optical waveguide has been described. The method allows for a highly manufacturable and cost effective method that provides accurate contact placement and repeatability. Further, this method allows for automated processing that further reduces cost.

What is claimed is:

1. A method for making a base with a contact area comprising the steps of:

molding a base with a first surface, a second surface, a first and second indent, and a groove wherein the first indent is located on the first surface, the second indent is located on the second surface and the groove interconnects the first and the second indent;

placing an electrically conductive member formed of reflowable material in the first indent located on the first surface; and melting the electrically conductive member, thereby flowing the electrically conductive member into the groove and into the second indent, thus forming a contact area from the first indent to the second indent.

2. A method for making a base with a contact area as claimed in claim 1 where, in the step of molding a base with a first surface, a second surface, a first and second indent, and a groove, the molding of the first indent is shaped spherically.

3. A method for making a base with a contact area as claimed in claim 1 wherein the step of placing an electrically conductive member formed of reflowable material in the first indent located on the first surface includes selecting the reflowable material from a group including solder, solder paste, and gold.

4. A method for making a base with a contact area as claimed in claim 1 wherein the step of melting the electrically conductive member is accomplished by thermal heating.

5. A method for making a base with a contact area as claimed in claim 4 wherein the step of thermal heating is achieved by using a laser light.

6. A method for making contact areas on a waveguide comprising the steps of:

providing a waveguide with first surface, a second surface, a first and second indent with a bottom surface, and a groove with a bottom surface wherein the first indent is located on the first surface, the second indent is located on the second surface and the groove interconnects the first and the second indent;

coating at least the bottom surface of the first indent, the bottom surface of the second indent, and the bottom surface of the groove with a metal material;

placing a melting member that melts from a temperature from 100 degrees Celsius to 260 degrees Celsius in the first indent located on the first surface;

melting the low temperature melting member, thereby flowing the low temperature melting member into the groove and into the second indent, this forming a molded waveguide contact area from the first indent and the second indent; and removing unwanted portions of the metal material from around the first indent, the second indent, and the groove, thereby making waveguide contacts.

7. The method for making contact areas on a waveguide of claim 6 wherein the step of coating is accomplished by evaporation.

8. The method for making contact areas on a waveguide of claim 6 wherein the step of coating is accomplished by sputtering.

9. The method for making contact areas on a waveguide of claim 6 wherein the step of removing of unwanted portions of the metal material is accomplished by chemical isotropic etching.

* * * * *